United States Patent
Spahn

(10) Patent No.: US 7,241,983 B2
(45) Date of Patent: Jul. 10, 2007

(54) METHOD FOR READING OUT A SURFACE DETECTOR

(75) Inventor: Martin Spahn, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 198 days.

(21) Appl. No.: 11/096,383

(22) Filed: Mar. 31, 2005

(65) Prior Publication Data
US 2005/0218296 A1 Oct. 6, 2005

(30) Foreign Application Priority Data
Mar. 31, 2004 (DE) ............ 10 2004 015 876

(51) Int. Cl.
H04N 5/30 (2006.01)
H04N 1/40 (2006.01)

(52) U.S. Cl. .................... 250/208.1; 348/246

(58) Field of Classification Search ........... 250/208.1, 250/370.09; 348/246
See application file for complete search history.

(56) References Cited

U.S. PATENT DOCUMENTS

| | | | | |
|---|---|---|---|---|
| 4,237,488 A * | 12/1980 | Takemura | ............... | 348/616 |
| 5,499,114 A * | 3/1996 | Compton | ............... | 358/483 |
| 5,886,353 A * | 3/1999 | Spivey et al. | ............... | 250/370.09 |
| 6,497,511 B1 | 12/2002 | Schmitt et al. | | |
| 6,512,217 B1 * | 1/2003 | Kameshima | ............... | 250/208.1 |
| 6,529,618 B1 * | 3/2003 | Ohara et al. | ............... | 382/132 |
| 6,665,009 B1 * | 12/2003 | Dong | ............... | 348/246 |
| 6,693,668 B1 * | 2/2004 | May et al. | ............... | 348/247 |
| 6,744,912 B2 * | 6/2004 | Colbeth et al. | ............... | 382/132 |
| 6,763,084 B2 * | 7/2004 | Boehm et al. | ............... | 378/62 |
| 6,806,902 B1 * | 10/2004 | Donovan | ............... | 348/246 |
| 6,900,836 B2 * | 5/2005 | Hamilton, Jr. | ............... | 348/241 |
| 6,961,478 B2 * | 11/2005 | Inoue | ............... | 382/284 |
| 7,003,146 B2 * | 2/2006 | Eck et al. | ............... | 382/132 |
| 7,015,961 B2 * | 3/2006 | Kakarala | ............... | 348/246 |
| 7,068,854 B1 * | 6/2006 | Aufrichtig et al. | ............... | 382/275 |
| 7,142,705 B2 * | 11/2006 | Inoue et al. | ............... | 382/132 |
| 2002/0065611 A1 * | 5/2002 | Boehm et al. | ............... | 702/35 |
| 2002/0141255 A1 * | 10/2002 | Inoue | ............... | 365/200 |
| 2003/0016854 A1 * | 1/2003 | Inoue et al. | ............... | 382/132 |
| 2003/0151683 A1 * | 8/2003 | Karunen et al. | ............... | 348/246 |
| 2003/0169847 A1 | 9/2003 | Karellas et al. | | |
| 2004/0095488 A1 * | 5/2004 | Rambaldi et al. | ............... | 348/246 |
| 2004/0119856 A1 * | 6/2004 | Nishio et al. | ............... | 348/246 |
| 2004/0252874 A1 * | 12/2004 | Yamazaki | ............... | 382/132 |
| 2006/0067590 A1 * | 3/2006 | Inoue | ............... | 382/284 |

* cited by examiner

Primary Examiner—John R. Lee

(57) ABSTRACT

A method for reading out a surface detector (3) is proposed, the information content of a faulty detector element (16) being initially corrected with the aid of adjacent detector elements, and then the information content of a plurality of detector elements being combined in each instance into one image element (20) in an X-ray image (11).

11 Claims, 4 Drawing Sheets

Prior Art

METHOD FOR READING OUT A SURFACE
DETECTOR

CROSS REFERENCE TO RELATED APPLICATIONS

This application claims priority to the German application No. 10 2004 015 876.2, filed Mar. 31, 2004 which is incorporated by reference herein in its entirety.

FIELD OF INVENTION

The invention relates to a method for reading out a surface detector, a plurality of detector elements of the surface detector being combined into an image element in each instance, after an image recording.

BACKGROUND OF INVENTION

These types of method for reading out a surface detector are generally known. Methods for reading out digital flat panel detectors are used within the field of X-ray technology. These flat panel detectors comprise active readout matrixes which are manufactured for example from amorphous silicon. An X-ray converter is positioned above the active readout matrix, made from caesium iodide for example, which converts the incoming X-ray light into optical light. The optical light falls on photodiodes of the active readout matrix and is converted there into electrical charge. The electrical charge is initially stored in the photodiodes and must subsequently be read out from the flat panel detector.

In addition, flat panel detectors are also known which similarly have an active readout matrix made from amorphous silicon, said flat panel detectors having a converter which directly generates electrical charge when X-ray light arrives. Converters of this type are manufactured on the basis of selenium for example. The charges generated in the converter are then stored on electrodes and must be read out from there.

Further surface detectors are image amplifying camera systems based on television or CCD cameras, storage film systems with an integrated or external readout unit, systems with optical linking of a converter film to a CCD camera or large-area CMOS chip or surface detectors with APS (active pixel sensor).

SUMMARY OF INVENTION

One problem common to any type of surface detectors is faulty detector elements which are also referred to as defect pixels in terms of flat panel detectors.

This is explained below in more detail using flat panel detectors as an example.

Although the flat panel detectors are manufactured in high-quality cleanrooms, a certain number of defect pixels cannot be ruled out during the manufacture of flat panel detectors. Defect pixels in quantities which can be justified within clinical applications are accepted in order to maintain the yield during production and the costs during manufacture in a reasonable manner.

During the recording of X-ray images, the defect pixels supply a signal value which does not correspond to a correctly functioning, error-free pixel. For example, the signal value of the defect pixel can assume a minimum or a maximum irrespective of the arriving X-rays, this corresponding to a black tone or a white tone used in the grey value scale to display X-ray images. The defect pixel can however be far noisier than the pixels surrounding it, or exhibit a considerably lower or higher sensitivity.

The faulty detector elements are typically determined within the framework of a calibration of the surface detector, irrespective of the type of surface detector. Since the faulty detector elements are known after calibration, the signal values of the faulty detector elements can be corrected with the aid of an interpolation method, said method being based on the signal values of the adjacent, error-free detector elements.

Occasionally however, the surface detectors are not read out with the maximum possible resolution. By way of example, a surface detector which is designed for radiographic and fluoroscopic examinations can be read out both with the full resolution and also with a reduced resolution. When reading out with a reduced resolution, adjacent detector elements are combined, in which signal values of adjacent detector elements are averaged in a simple fashion. The simple combination of the signal values of adjacent detector elements is also termed as binning.

One disadvantage of the so called binning is that faulty detector elements corrupt the result of the binning, since the faulty signal value of the faulty detector element propagates in the signal value of the binned image element. As the signal value of the binned image element now no longer corresponds to the true signal value, the complete region of the binned image element must be viewed as faulty and subsequently corrected. The correction is typically carried out again using an interpolation method. Nevertheless, the bigger the region to be interpolated of the faulty, binned image element, the more inaccurate the result of the interpolation. This is particularly the case if the object displayed produces locally marked signal changes. Examples of this are fine bone structures in the extremities, catheters which produce a clear contrast to their surroundings, the diameters of which can lie in the region of approximately 100 µm, or also implants, screws or wires which can cause large contrast jumps on the projected edges. The known method for reading out the surface detectors can result in a wire or catheter, which is mapped across a faulty detector, appearing interrupted in the finished image, since the signal values of adjacent binned image elements are used for the interpolation of the faulty binned image element, said signal values having the signal values of a background and not the signal values of the wire or the catheter.

An object of the invention based on this prior art is to specify a method for reading out a surface detector, the information content of faulty detector elements being effectively corrected.

This object is achieved by means of a method with the features of the independent claim. Advantageous embodiments and developments are set down in the dependent claims.

In the method, the information content of faulty detector elements is first corrected with the aid of the information content of adjacent detector elements, and subsequently the information content of a plurality of detector elements is combined into one image element in each instance.

The correction of the information content of the defective detector elements before a combination of the information content of adjacent detector elements prevents the faulty information content of a detector element in the image element from propagating and thereby making necessary a large-area interpolation to correct the image element.

In a preferred embodiment the information content of the detector element is initially completely digitized, and the information content of a faulty detector element is corrected by means of an interpolation method based on adjacent error-free detector elements. This embodiment is advantageous in that the information content of the complete surroundings enters the correction of the information content of the faulty detector element. Artifacts in the finished image are effectively repressed.

In a further preferred embodiment, the information content of a faulty detector element is corrected, in that the information content of the faulty detector element is replaced by the information content of an adjacent error-free detector element. A correction of this type can also take place if the information content is shown by means of an analog parameter, a charge of a detector element for instance. Furthermore, the correction can be carried out very quickly.

Furthermore, it is possible for the information content of adjacent detector elements to be initially combined in a collection route to generate intermediate image elements and for faulty intermediate image elements to be subsequently corrected before adjacent intermediate image elements are combined into image elements. A procedure of this type is always offered if, in a first stage in which the information content of the detector elements is still present in analog form, a combination of adjacent detector elements is necessary or possible already for constructive reasons. In this context, the correction of the intermediate image elements can be carried out by means of an interpolation on the basis of adjacent intermediate image elements or by means of replacing faulty intermediate image elements by means of adjacent intermediate image elements.

BRIEF DESCRIPTION OF THE DRAWINGS

Further features and advantages of the invention are set out in the description below, the exemplary embodiments of the invention being described with reference to the accompanying drawing, in which.

DETAILED DESCRIPTION OF INVENTION

Figure 1:
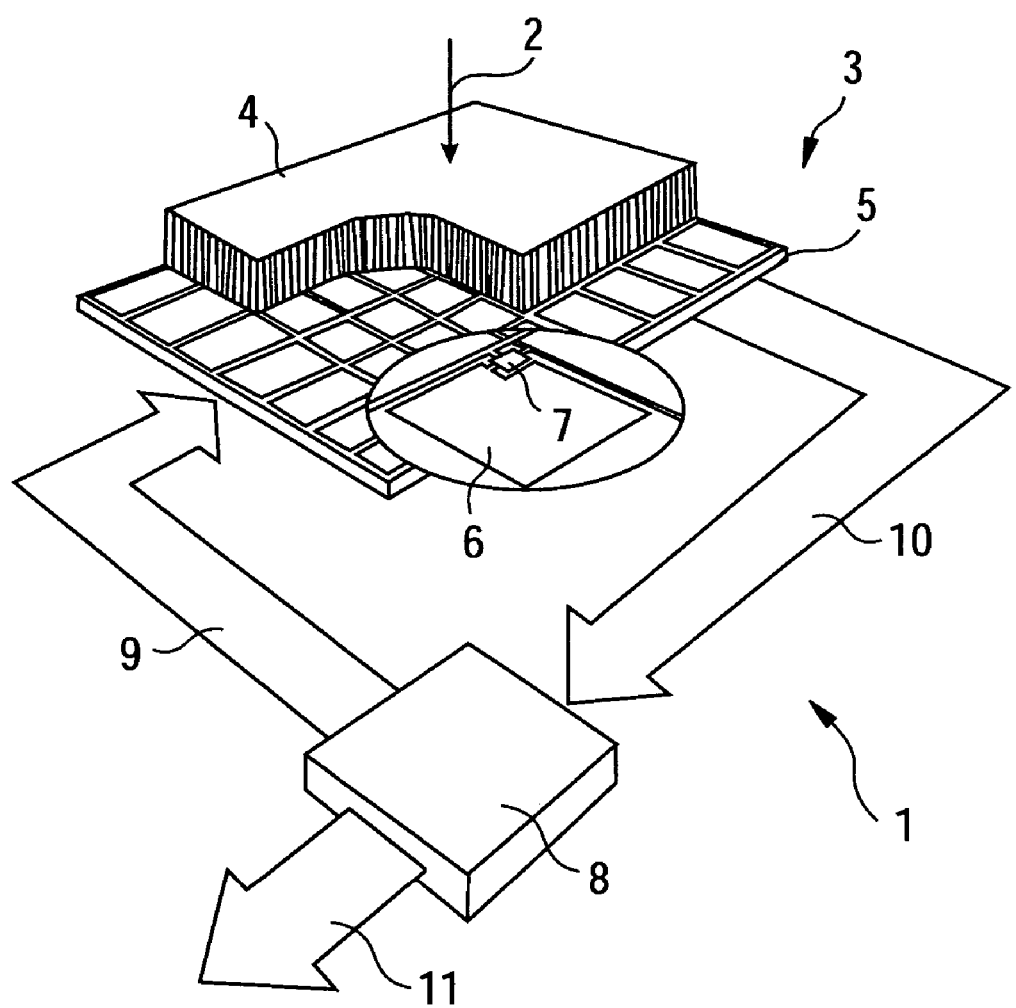
FIG. 1 shows the design of an image recording device of an X-ray device equipped with a flat panel detector.

FIG. 1 shows an image recording device, which is part of an X-ray device comprising an X-ray source (not shown in FIG. 1) for generating X-rays 2. The X-rays 2 hit a flat panel detector 3 after passing through an object to be illuminated. The flat panel detector 3 typically has dimensions of 30 times 30 centimeters. The flat panel detector 3 has a scintillator 3, which is made from CsI for instance. An active readout matrix 5 is positioned below the scintillator 3, which is typically manufactured on the basis of amorphous silicon. A field of photodiodes 6 is designed on the active readout matrix 5. The light generated in each instance in the scintillator 4 via the respective photodiode 6 is absorbed in the photodiode 6. Electron hole pairs are generated with the absorption which travel to the anode and cathode of the respective photodiodes 6 in each instance. The charge quantity generated in this manner is stored in the relevant photodiode 6 until the photodiode 6 is read out with the aid of an active circuit element 7. The active circuit elements 7 are activated by an evaluation unit 8 line by line via address lines 9. The charge stored in the photodiode 6 is read out column by column via data lines 10.

It is explicitly noted that the term evaluation unit 8 is to be seen as representing a function. The evaluation unit 8 does not necessarily need to be realized in an individual semiconductor component. In fact the evaluation unit 8 can comprise a plurality of semiconductor components on one or more circuit boards. The evaluation unit 8 can also include function groups in different devices. The evaluation unit 8 has the task of controlling and monitoring the flat panel detector 3. A further task of the evaluation unit can be generating a digital X-ray image 11 which is suitable for diagnosis purposes from the digital raw data, and to issue this to a display unit (not shown in FIG. 1).

Figure 2:
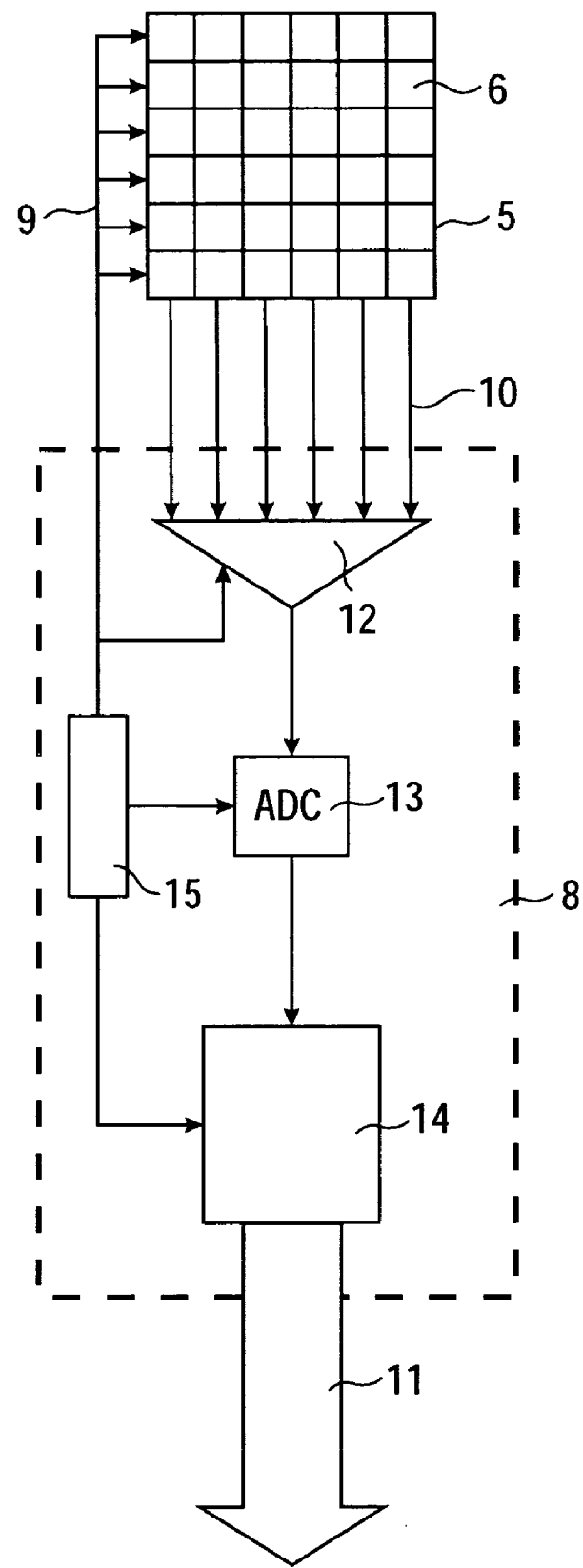
FIG. 2 shows a block diagram of a circuit to be used for reading out the flat panel detector from FIG. 1.

FIG. 2 shows a block diagram of the evaluation unit 8 from FIG. 1. The evaluation unit 8 has a multiplexer 12 which amplifies the charges read out from the photodiodes 6 via the data lines and supplies the analog-to-digital converter 13. The analog-to-digital converter 13 generates the digital values corresponding to the charges of the photodiodes 6, said digital values being supplied to a signal processing unit 14. The signal processing unit 14 produces the finished X-ray image 11 from the digital values. The multiplexer 12, the analog-to-digital converter 13 and the signal processing unit 14 are controlled with the aid of a control unit 15 which can also address the photodiode 6 of the active readout matrix 5 line by line via the address lines 9.

The readout matrix 5 and the multiplexer 12 together form the analog part of the image recording device 1. In contrast, the signal processing unit 14 displays the digital part of the image recording device 1.

The photodiodes 6 of the flat panel detector 3 can now be read-out in various ways by the evaluation unit 8.

Figure 3:
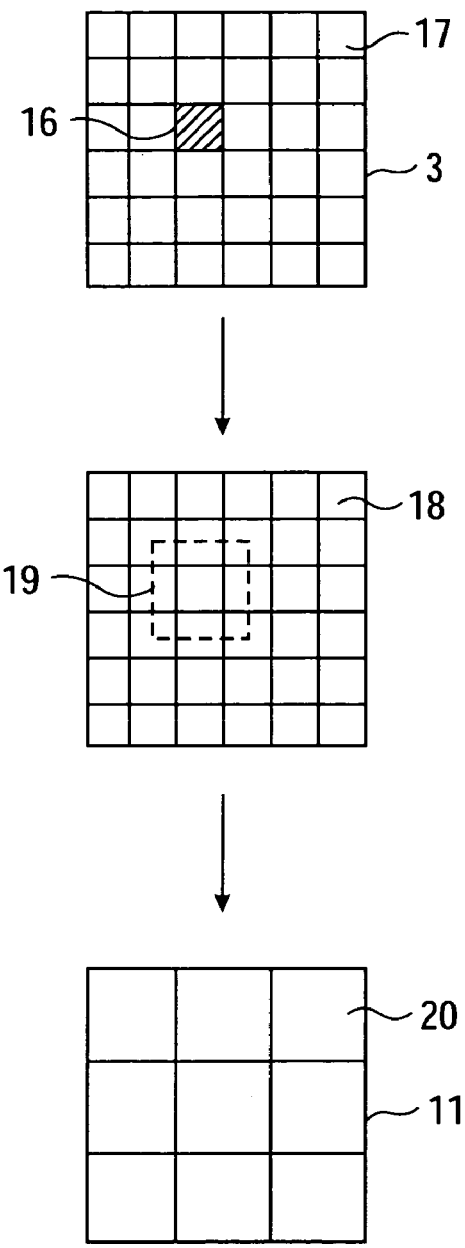
FIG. 3 shows the procedure of a readout method which can be used for reading out the flat panel detector from FIG. 1.

FIG. 3 shows the individual steps of a first embodiment of the readout method which can be used for reading out the flat panel detector 3.

In the exemplary embodiment shown in FIG. 3, the flat panel detector 3 contains a faulty pixel 16, which is embedded in error-free pixels 17. The malfunction of the faulty pixel 16 can stem from a fault location in the scintillator 4, an error in the photodiode 6 or in the active circuit element 7 or from other errors of the readout electronics used. The type of malfunction is not subject to any restrictions. The faulty pixel 16 can have failed completely, only show maximum or minimal values or be characterized by disproportionately strong noise or a low sensitivity. Unlike the case shown in FIG. 3, the faulty pixel 16 can be positioned adjacent to further faulty pixels 16.

Pixels 16 and 17 are now converted into digital values 18 by way of the multiplexer 12 and the analog-to-digital converter, said digital values being processible by the signal processing unit 14. The incorrect value of the faulty pixel 16 is adjusted with the aid of an interpolation method based on an interpolation area 19 shown with a dashed line in FIG. 3. The individual digital values 18 can then be combined into image points 20 of the finished X-ray image. In the present image, 2×2 digital values 18 assigned to the pixels 16 and 17, are combined into one image point 20.

Figure 4:
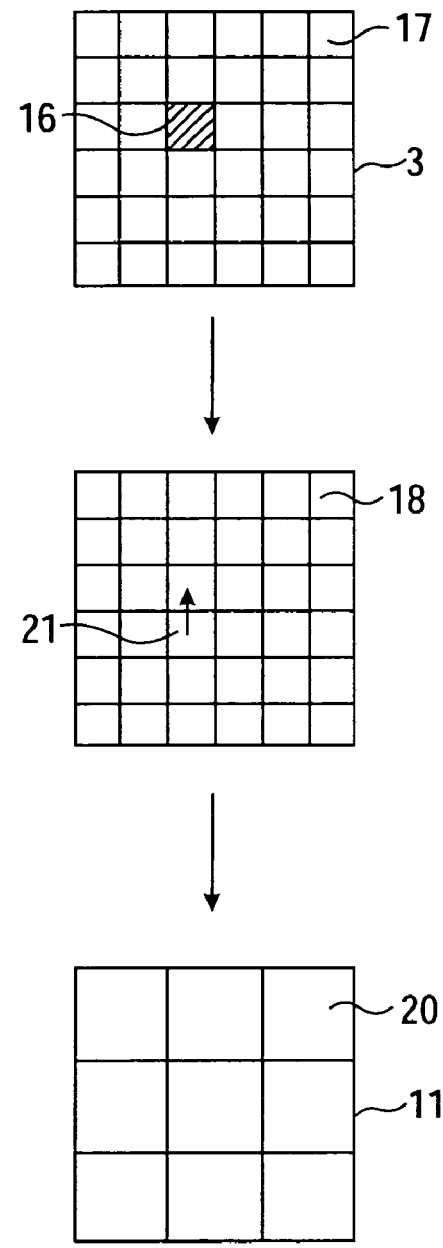
FIG. 4 shows the procedure of a readout method which can be used for reading out the flat panel detector from FIG. 1.

FIG. 4 illustrates a further readout method, the faulty pixel 16 not being corrected in the digital part of the image recording device 1, but instead in the analog part of the image recording device 1. It is possible to control the multiplexer 12 for instance, so that the charge of an adjacent pixel 21 is issued to the analog-to-digital converter 13 instead of the charge of the faulty pixel 16. In this embodiment of the readout method, costly and time-consuming interpolation can be dispensed with. This means however that under some circumstances the disruption to the finished X-ray image 11 is quite noticeable for the observer.

Figure 5:
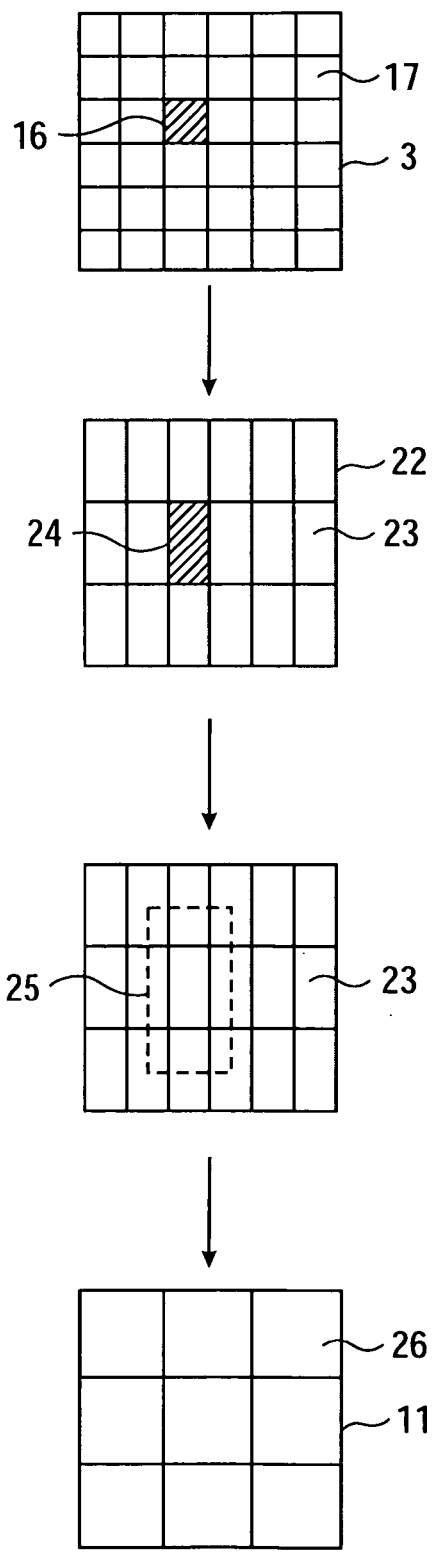
FIG. 5 shows the procedure of a third readout method which can be used for reading out the flat panel detector in FIG. 1.

In a further variation of the readout method shown in FIG. 5, the active readout matrix 5 is binned in an analog manner by means of the multiplexer 12, by the simultaneous activation of two address lines 9 during reading out. After digitization by means of the analog-to-digital converter 13, this results in an intermediate image 22 with error-free intermediate image element 23 and a faulty intermediate image element 24. An interpolation carried out in the signal processing unit 14 which is preferably based on an interpolation area 25 shown with a dashed line in FIG. 5, allows the faulty intermediate image element 24 to be corrected. In comparison with the embodiments described in FIGS. 3 and 4, this embodiment has a higher processing speed as a result of the analog binning. A lower quality for X-ray image 11 must however be accepted.

Figure 6:
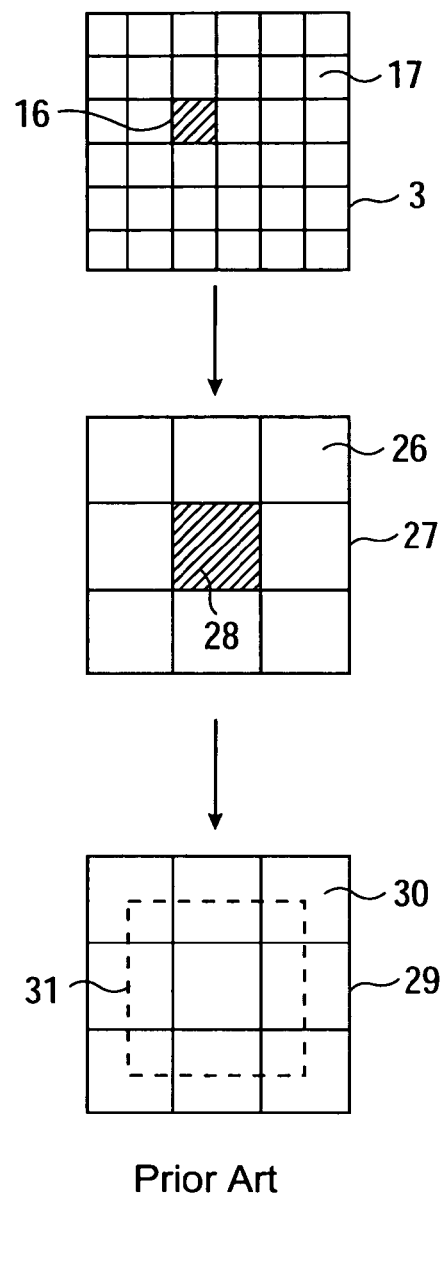
FIG. 6 shows a procedure of a conventional readout method.

Finally, in contrast, FIG. 6 shows a readout method according to the prior art. In conventional readout methods the faulty pixels 16 and the faulty pixels 17 are combined into intermediate image elements 26 of an intermediate image 26 after digitization. This results in an extended faulty intermediate image element 28, which must be corrected for a finished image 29 with image elements 30 with the aid of an interpolation method based on an extended interpolation area 31. In particular, large-area image faults can result when a number of faulty pixels 16 are present.

The method described here for reading out surface image detector 3 can also be applied to surface detectors operating according the CCD camera principle. In particular, the readout method described with reference to FIGS. 3 and 4 can also be applied in conjunction with a CCD camera. It is therefore possible to firstly digitize the charges of an individual image element in a CCD camera, and then to interpolate faulty pixels. It is possible to precisely control the output of the charge values to the analog to digital converter such that the analog to digital converter contains the charge of an adjacent fault-free pixel instead of the charge of a faulty pixel.

The invention claimed is:

1. A method of reading out a surface detector having a plurality of detector elements including a defective detector element, comprising:
   acquiring an image having a plurality of image elements by the surface detector;
   initially correcting image data of the defective detector element based on image date of error free detector elements adjacent to the defective detector element before combining image data of the plurality of the detector elements; and
   combining the image data of the plurality of the detector elements including the corrected image data of the defective detector element to form the plurality of image elements.

2. The method according to claim 1, wherein the image data of the detector clements is digitized and the digitized image data of the defective detector element is corrected using an interpolation algorithm based on the digitized image data of the detector elements that completely surround the defective detector element.

3. The method according to claim 1, wherein the image data of the defective detector element is substituted with image data of one of the adjacent detector elements which contains no error, and the substituted image data and the image data of the adjacent detector elements are transmitted to a digital converter for generating digitized image data.

4. The method according to claim 1, wherein
   plurality of intermediate image elements are generated by combining image data of adjacent detector elements including the defective detector element,
   an intermediate image is created based on the intermediate image elements including a defective intermediate image element having the image data of the defective detector element,
   the defective intermediate image element is corrected using an interpolation algorithm based on image data of the intermediate image elements adjacent to the defective intermediate image element, and
   the intermediate image elements including the corrected defective intermediate image element are transmitted to a digital converter for generating digitized image data.

5. The method according to claim 1, wherein the surface detector is a flat panel detector having an active readout matrix.

6. The method according to claim 1, wherein the surface detector operates as a CCD camera.

7. An read out unit for reading out a surface detector having a plurality of detector elements including a defective detector element, comprising a control unit configured to:
   initially correct image data of the defective detector element based on image date of detector elements adjacent to the defective detector element; and
   combine the image data of the plurality of the detector elements including the corrected defective detector element to form a plurality of image elements.

8. The method according to claim 1, wherein the defective detector element is identified using image date of detector elements adjacent to the defective detector element.

9. The method according to claim 1, wherein the image data of the defective detector element is corrected by an interpolation based on the image data of adjacent error free detector elements that completely surround the defective detector element.

10. The read out unit according to claim 7, wherein the defective detector element is identified using image date of detector elements adjacent to the defective detector element.

11. The read out unit according to claim 7, wherein the image data of the defective detector element is corrected by an interpolation based on the image data of adjacent error free detector elements that completely surround the defective detector element.

* * * * *